United States Patent [19]
Kuroe

[11] Patent Number: 5,703,489
[45] Date of Patent: Dec. 30, 1997

[54] TIMING CALIBRATION CIRCUIT AND METHOD FOR TEST SIGNALS

[75] Inventor: Shinichiro Kuroe, Gyoda, Japan

[73] Assignee: Advantest Corporation, Tokyo, Japan

[21] Appl. No.: 518,039

[22] Filed: Aug. 22, 1995

[30] Foreign Application Priority Data

Aug. 22, 1994 [JP] Japan .................................. 6-220971

[51] Int. Cl.$^6$ .......................... G01R 35/00; G01R 25/00
[52] U.S. Cl. ...................... 324/601; 324/130; 324/76.54; 324/76.63; 324/76.74; 364/571.01
[58] Field of Search ........................................ 324/130, 601, 324/76.16, 76.52, 76.54, 76.62, 76.63, 76.74, 76.77; 73/5; 364/571.01, 571.04

[56] References Cited

U.S. PATENT DOCUMENTS

| | | | |
|---|---|---|---|
| 4,829,236 | 5/1989 | Brenardi et al. | 324/130 X |
| 5,471,145 | 11/1995 | Mydill | 324/601 |
| 5,539,304 | 7/1996 | Payne et al. | 324/130 X |

Primary Examiner—Glenn W. Brown
Attorney, Agent, or Firm—Knobbe, Martens, Olson & Bear, LLP

[57] ABSTRACT

A timing calibration circuit includes a plurality of variable delay circuits each of which is assigned to one of test signal paths to regulate a phase delay time for a signal passing therethrough, a multiplexer for selecting one of the test signal paths whose inputs are connected to outputs of drivers, a signal path whose one end is connected to all of test contactors and the other end is connected to the multiplexer, a counter for measuring phase delay times in a first feedback loop which does not include the signal path and a second feedback loop which includes the signal path with respect to each of the test signal paths. The counter measures a phase delay time for the first feedback loop to determine a reference value so that a phase delay time in the first feedback loop for other test signal paths is adjusted by the variable delay circuit to be equal to the reference value, and the counter measures a phase delay time for the second feedback loop to determine a calibration value for each of the test signal paths and record the calibration value.

8 Claims, 3 Drawing Sheets

TIMING CALIBRATION CIRCUIT AND METHOD FOR TEST SIGNALS

FIELD OF THE INVENTION

This invention relates to a timing calibration circuit structure and method for generating test signals by a semiconductor test system.

BACKGROUND OF THE INVENTION

In testing semiconductor devices, such as a semiconductor memory, the device 1 to be tested is placed at a test point C of a test head of a semiconductor test system by, for example, an automatic handler. A schematic diagram including basic components of a semiconductor test system and a device to be tested is shown in FIG. 3. At the test point C, test contactors $2_1$-$2_n$ are arranged to provide test signals $3_1$-$3_n$ to the corresponding pins of the device 1 to be tested. The device 1 will respond to the test signals and provide resulted signals to the semiconductor test system through the test contactors $2_1$-$2_n$ to be evaluated.

The test signals 3 which have been wave shaped in the test system are provided from drivers 5 through a point B to the device 1 to be tested. The test contactors $2_1$-$2_n$ have a structure to realize a mechanical contact to the input and output pins of the device 1 to establish an electronic connection between the test system and the pins of the device to be tested. For such purposes, although not shown, separate mechanisms, one for affixing the device to be tested at the test point C and the other for driving the test contactors to mechanical contact with the device pins are provided in the semiconductor test system. Each of the test signals $3_1$-$3_n$ is supplied to the corresponding pin of the device to be tested through the corresponding test signal path or the test signal channel including wave-formatters $7_1$-$7_n$, variable delay circuits $6_1$-$6_n$, drivers $5_1$-$5_n$ and the test contactors $2_1$-$2_n$ of the test system.

For accurate testing of a semiconductor device under test, all of the test signals must be provided at the test contactors $2_1$-$2_n$ at the same time. However, due to the following reasons, there exist phase errors or timing differences between the test signals $3_1$-$3_n$ at the test point C. One of the reasons is that there arise differences in phase delay times (signal propagation times) between different test signal paths (test channels) running from an output of a timing generator 8 (point A) to the test contactors 2 (point C) through the wave-formatters 7. The other reason is that there arise differences in the phase delay times between the different test signal paths because of the differences in response to ambient temperature or other external conditions by semiconductor devices or other components used in corresponding circuits of the test signal paths such as the wave-formatters 7.

In the conventional test system for calibration of test signals 3 to eliminate the phase delay time differences, clock signals are generated by the timing signal generator 8 at the point A for each test signal path so that the timing is to be calibrated. Each clock signal passes through the wave-formatter 7, then a point B which is an output of the driver 5, a multiplexer 16 and to a point D which is an input of a reference comparator 13. The timing of the clock signal is compared at the point D with a reference clock 14 by the reference comparator 13. The variable delay circuits $6_1$-$6_n$ are adjusted so that difference between the reference clock 14 and the clock signal in the test signal path becomes zero. This procedure of adjusting the phase delay time difference is performed for each test signal path corresponding to each of the test signals $3_1$-$3_n$ that is to be applied to the device under test. As a result, the phase difference between the test signal paths at the point B which is the output of the drivers 5 is corrected.

Therefore, in the conventional technology for calibrating the phase delay time differences, only the path length of the test signal path extending from the point A which is the output of the timing generator 8 to the point D which is the input of the reference comparator 13 can be calibrated. Namely, the conventional timing calibration circuit or method does not includes in its calibration paths, the point C where the test contactors 2 are arranged. Because of this reason, in the conventional technology, a timing difference between the test signal paths including the corresponding test contactors 2 cannot be fully calibrated and thus causes a timing error.

For example, with respect to a first test signal path and a third test signal path of FIG. 3, a timing difference between the phase delay time in the test signal path extending from the output of the driver $5_1$ to the test contactor $2_1$ and the phase delay time in the path extending from the output of the driver $5_3$ to the test contactor $2_3$ cannot be calibrated and there will be a timing error. Similarly, a time difference between the phase delay time in the test signal path extending from the output of the driver $5_1$ to the input of the reference comparator 13 and the phase delay time in the test signal path extending from the output of the driver $5_3$ to the reference comparator 13 cannot be calibrated which causes a timing error.

In a recent semiconductor test system, the number of such test signal paths ranges up to several hundreds. The phase delay time differences in the test signal paths are caused by differences in physical conditions in the test signal paths, changes in the signal routes in the wave-formatters, different responses in the semiconductor devices in the test signal paths to the environmental effects such as temperature changes. In the conventional technology of timing calibration, the maximum available precision was plus or minus 200 picosecond for minimizing the phase time difference between the test signal paths.

Since the recent semiconductor devices have become more and more high speed, the phase delay time differences of plus or minus 200 picosecond between the test signal paths for providing the test signals in the conventional technology of the semiconductor test system is not sufficient to test the recent high speed semiconductor devices.

Therefore, there is a need in a semiconductor test field to calibrate the timing differences caused by the phase delay time differences in a plurality of test signal paths, i.e., test signal channels that provide test signals to a semiconductor device under test in a semiconductor test system.

SUMMARY OF THE INVENTION

Therefore, an object of the present invention is to provide a timing calibration circuit and a timing calibration method which are capable of considerably minimizing phase delay time differences between a plurality of test signal paths for providing the corresponding test signals to a semiconductor device under test.

According to the present invention, a timing calibration circuit for test signals is to be used in a semiconductor test system having a timing generator, a plurality of test signal paths each of which having a wave-formatter for shaping waveforms of a test signal, a driver for determining an amplitude of the test signal and a test contactor for providing electronic connection with a corresponding pin of a semiconductor device to be tested by the semiconductor test system.

The timing calibration circuit includes a plurality of variable delay circuits each of which is assigned to one of the test signal paths wherein each of the variable delay circuits changes a phase delay time for a signal passing therethrough, a multiplexer for selecting one of the test signal paths for the timing calibration purpose wherein inputs of the multiplexer are connected to outputs of the drivers, a first signal path having a point of connection at one end which is connected to all of the test contactors and other end of the signal path is connected to the multiplexer, a means for measuring a phase delay time for signal propagation through a second signal path from the multiplexer when receiving a pulse signal originated by the timing generator and triggering the timing generator at the timing determined by the received pulse signal, wherein the multiplexer forms a first feedback loop and a second feedback loop with respect to each of the test signal paths, the first feedback loop includes the driver, the test contactor and the first signal path and the second feedback loop does not include the test contactor and the first signal path, the measuring means measures a phase delay time for the first feedback loop to determine a reference value so that a phase delay time in the first feedback loop for every other test signal path be adjusted by the variable delay circuit to be equal to the reference value, and the measuring means measures a phase delay time for the second feedback loop to determine a calibration value for each of the test signal paths and record the calibration value.

In a further aspect of the present invention, for calibration of a timing error caused by changes of circuit components or environmental effects, the second feedback loop is formed by the multiplexer for any one of the test signal paths to be calibrated, and the measuring means measures a phase delay time in the second feedback loop so that the phase delay time is adjusted by the variable delay circuit to be equal to the calibration value previously obtained with respect to the test signal path.

According to the present invention, the phase delay times in the feedback loops for all of the test signal paths are adjusted to be equal to the reference value. Such feedback loops include a point which is the output of the drivers and a point which is positioned at the test contactors corresponding to the test signal paths. Thus, it is possible to minimize the phase delay time differences between the test signal paths to, for example, plus or minus 50 picosecond.

Furthermore, in the present invention, the timing errors caused by changes of circuit structures in the waveformatters or changes in the environmental conditions such as ambient temperature are effectively compensated based on the calibration value obtained when each of the test signal paths is adjusted to be equal to the reference value. This is because the phase delay time differences between the signal paths extending from the output of the drivers to the output of the multiplexer are canceled.

DETAILED DESCRIPTION OF THE PREFERRED EMBODIMENT

Figure 1:
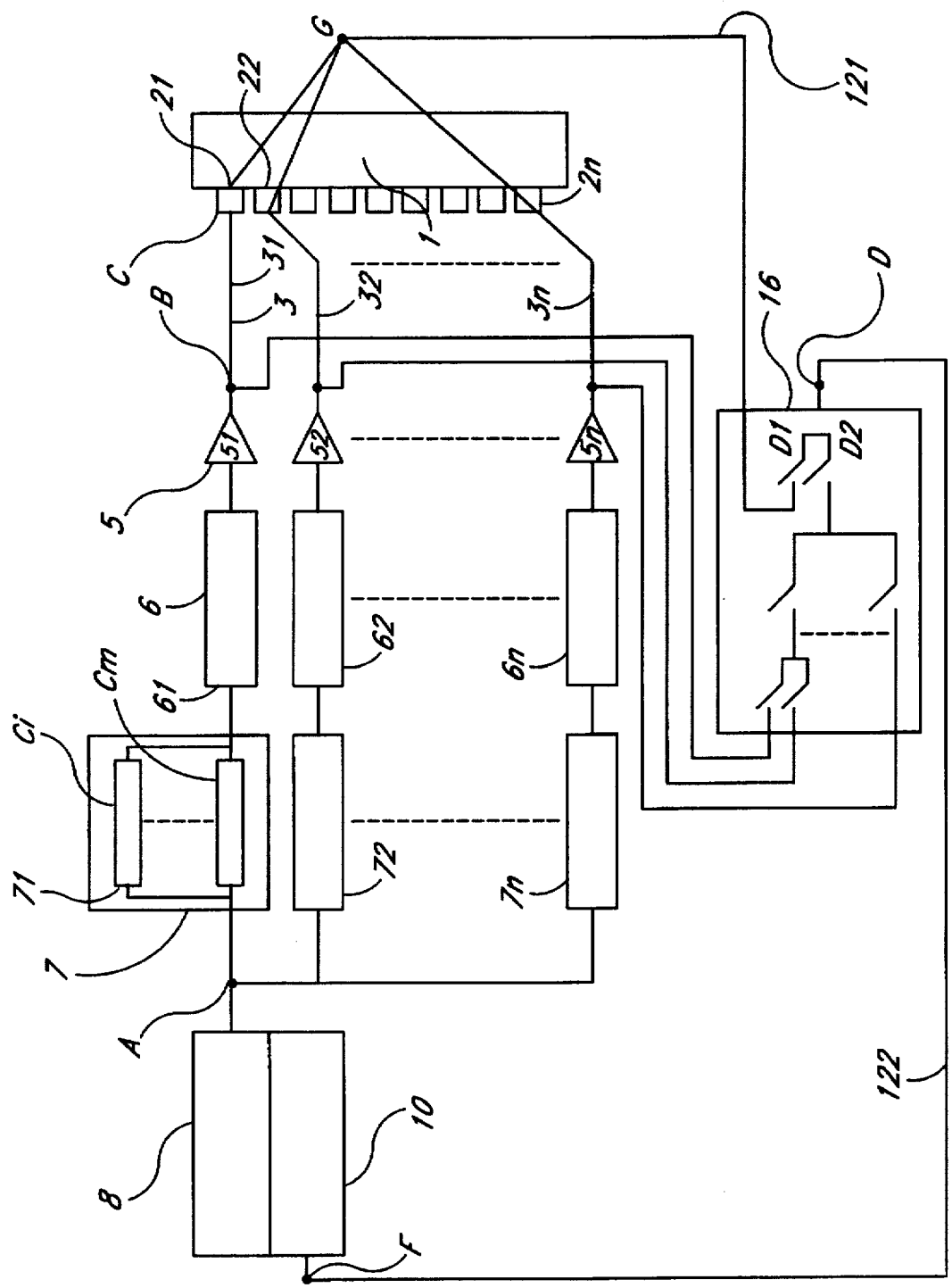
FIG. 1 is a block diagram showing an embodiment of the present invention.
Figure 2:
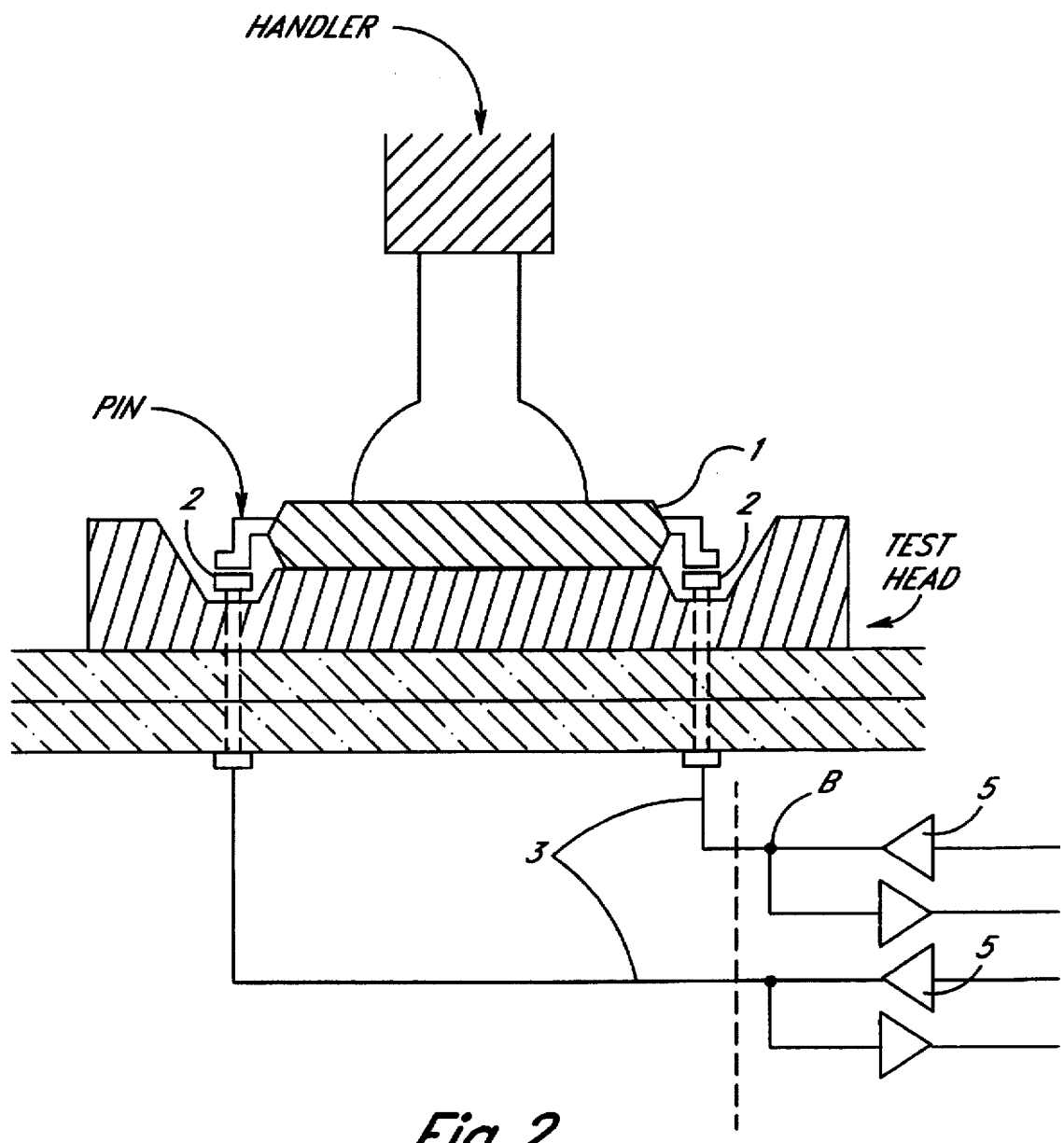
FIG. 2 is a schematic diagram showing a structure of the test contactors of the semiconductor test system of the present invention.

One of the embodiments of the present invention is shown in the block diagram of FIG. 1. An example of test contactors in the semiconductor test system of the present invention with respect to pins of a semiconductor device to be tested is shown in a schematic diagram of FIG. 2. As shown in FIG. 1, a number of test signal paths having the identical components are provided corresponding to the test contactors 2. The number of such test signal paths ranges up to several hundreds for testing a semiconductor device having several hundreds of pins. In FIG. 2, the test contactors 2 contact the pins of the device 1 to be tested while the device 1 is pressed by an automatic handler to maintain the sufficient electronic contact between the test contactors 2 and the pins of the device 1.

It should be noted that the timings at the position C, where a plurality of test signals 3 are supplied to the test contactors $2_1$-$2_n$, desired to be calibrated. In the present invention, a signal path $12_1$ for a calibration purpose is formed from the test contactors $2_1$-$2_n$ to the point D at the output of the multiplexer 16. The signal path $12_1$ has a point of connection at one end (point G) which is connected to all of the test contactors $2_1$-$2_n$ and other end which is connected to the multiplexer 16.

Further, a return signal path $12_2$ for the calibration purpose is formed from the point D to a point F which is an input of a frequency counter 10. The frequency counter 10 provides a trigger signal to the timing generator 8. The timing of the trigger signal is determined by a phase delay time, i.e., a signal propagation delay time of a signal received by the counter through the signal path $12_2$. The timing generator 8 generates a test signal, a start timing of which depends upon the trigger signal from the frequency counter 10.

Therefore, the timing calibration of the present invention forms two feedback loops with respect to each of the test signal paths. One of the feedback loops is a closed loop encompassing through the point A which is the output of the timing generator 8, the point B which is outputs of the drivers $5_1$-$5_n$, point C where the device 1 to be tested is connected to the test contactors $2_1$-$2_n$, then to a position D1 which is an input of a part of the multiplexer 16 through the point G where the single signal path $12_1$ is formed by connecting all of the output of the test contactors $2_1$-$2_n$, the point D which is the output of the multiplexer 16, and the point F which is the input of the frequency counter 10 to measure the phase delay time. The other feedback loop is a closed loop without passing through the test contactors 2, i.e., the signal path $12_1$ but directly connected from the point B which is the output of the drivers 5 to the multiplexer 16 and through the signal path $12_2$ to the point F at the input of the frequency counter 10.

In either feedback loops, because the loop is closed, once a pulse signal is generated by the timing generator 8, the pulse signal runs repeatedly through the feedback loop, thus forming consecutive pulse signals, the time interval of which is determined by the phase delay time (signal propagation delay time) of the feedback loop. The phase delay time can be evaluated by, for example, counting the frequency of the pulse signal or measuring the time interval of the pulse signal.

In operation, first, a variable delay circuit $6_1$ is set to an arbitrary value and a phase delay time in the feedback loop including the signal path $12_1$ is measured by the frequency counter 10. Namely, the feedback loop in this situation is a closed loop including the point A which provides the test signal $3_1$, the point B which is the output of the driver $5_1$, the point C wherein the test contactor $2_1$ is provided, the point G where all the signal lines from the test contactors $2_1$-$2_n$ are connected to form the signal path $12_1$, the point D1 which is the input of the part of the multiplexer 16 as shown in FIG. 1, the point D which is the output of the multiplexer 16, and the point F which is the input of the frequency counter 10.

The timing generator 8 generates a reference pulse so as to produce a continuous pulse train, the frequency of which represents a phase delay time or a signal propagation time of the feedback loop including both of the signal paths $12_1$ and $12_2$. The frequency counter 10 measures the frequency of the pulse train and records the measured value as a reference value.

Then, a phase delay time in the feedback loop without the signal path $12_1$ is measured by the frequency counter 10. Namely, the feedback loop in this situation is a closed loop including the point A which is the output of the timing generator 8, the point B which is the output of the driver $5_1$, the point D2 through the multiplexer 16 as shown in FIG. 1, the point D which is the output of the multiplexer 16, and the point F which is the input of the frequency counter 10. The frequency counter 10 measures the frequency of the pulse train in this feedback loop representing the phase delay time and records the measured value as a calibration value.

The above calibration procedures are related to the first test signal path, i.e., for the first test channel providing the test signal $3_1$ to the device to be tested through the test contactor $2_1$. In a similar manner, the calibration procedure is performed for the second test signal path which provides the test signal $3_2$ to the device to be tested through the test contactor $2_2$. Namely, a first feedback loop is formed which includes the point A which provides the test signal $3_2$, the point B which is the output of the driver $5_2$, the point C having the test contactor $2_2$, the point G where all the signal lines from the test contactors are connected to form the single path $12_1$, the point D1 of the multiplexer 16, the point D which is the output of the multiplexer 16, and the point F which is the input of the frequency counter 10 and then the input of the timing generator 8.

As in the same way as note with respect to the first test signal path or test channel, the timing generator 8 generates a reference pulse so as to produce a continuous pulse train whose frequency represents a phase delay time or a signal propagation time of the feedback loop having the second test signal path. The frequency counter 10 measures the frequency of the pulse train and the variable delay circuit $6_2$ is adjusted so that the measured value becomes equal to the reference value obtained with respect to the first test signal path.

Further, a phase delay time in the feedback loop without including the signal path $12_1$ is measured by the frequency counter 10. The feedback loop in this situation includes the point A which is the output of the timing generator 8, the point B which is the output of the driver $5_2$, the point D2 which is the input of the part of the multiplexer 16, the point D which is the output of the multiplexer 16, and the point F which is the input of the frequency counter 10. The frequency counter 10 measures the frequency of the pulse train in this feedback loop and records the measured value as a calibration value for the second test signal path (second test channel).

The same procedure as stated above is also performed for the third test signal path (third test channel) which includes the drive $5_3$ and the test contactor $2_3$. The feedback loop in this situation includes the connection point G and the single path $12_1$. The frequency of this feedback loop is adjusted by the variable delay circuit $6_3$ to be equal to the reference value. In addition, for the other feedback loop without having the signal path $12_1$, the frequency representing the phase delay time of the loop is measured and the measured value is recorded as a calibration value for the third test channel.

As has been described, as to the test contactors $2_1$–$2_3$, at the position C which provides the test signals to the device to be tested, each of the feedback loops including both the signal paths $12_1$ and $12_2$ is adjusted its frequency representing the phase delay time of the feedback loop to be equal to the reference value. As a result, the phase delay time caused in the path from the output of the driver $5_1$ to the test contactor $2_1$ and the phase delay time caused by the signal path from the output of the driver $5_3$ to the test contactor $2_3$ become the same value. Therefore, the timing error caused by the difference in the phase delay times between the first test signal path and the third test signal path will be eliminated. The above procedure will be repeated for all of the test signal paths.

Figure 3:
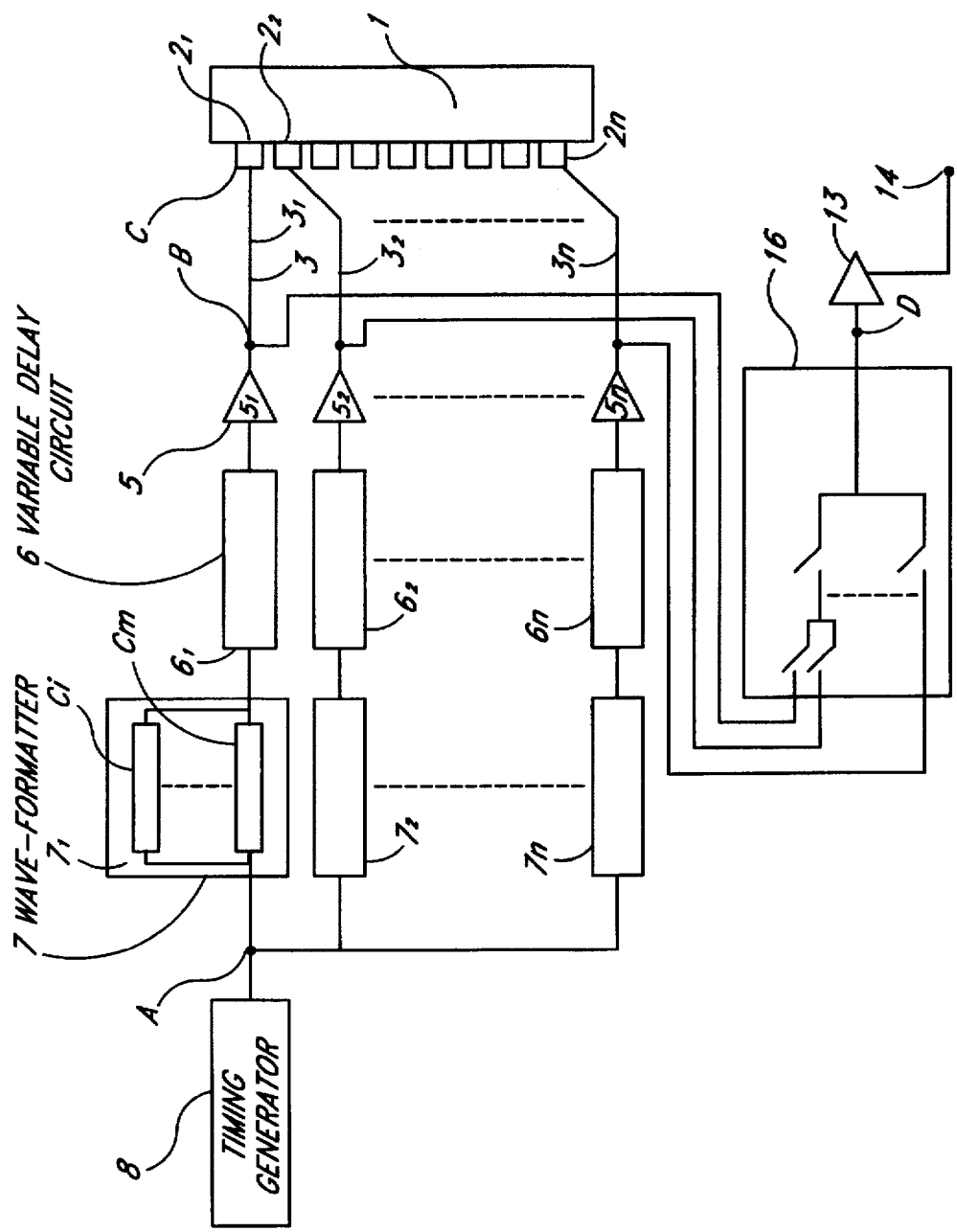
FIG. 3 is a block diagram showing a conventional timing calibration method and its circuit structure.

The phase delay time differences also arise when the test signals 3 to be provided to the device under test pass through different circuits in the wave-formatter $7_1$–$7_n$. In FIGS. 1 and 3, each of the wave-formatters $7_1$–$7_n$ includes wave-formatter circuits C1–Cm, the circuit configuration of which are different from one another to form different wave forms of test signals. Suppose, for example, the wave-formatter circuit C1 is set in the wave-formatter $7_1$, the wave-formatter circuit C2 is set to the wave-formatter $7_2$, and the wave-formatter circuit C3 is set to the wave-formatter $7_3$. Since the circuit configurations in the wave-formatter circuits C1, C2 and C3 are different, the wave-formatter circuits show the different responses to, for example, environment changes such as temperature, which causes phase delay time differences between the wave-formatters $7_1$–$7_3$. As a result, the test signals $3_1$–$3_3$ supplied to the device 1 to be tested will have different timings one another, which makes the test result of the device inaccurate.

In this situation, these timing differences can be minimized by a calibration procedure of the present invention described below. In case of calibrating the timing for the test signal path including the driver $5_1$, a feedback loop which includes the driver $5_1$ is formed, i.e., the point A which is the output of the timing generator 8, the point B which is the output of the driver $5_1$, the points D2 and D with regard to the multiplexer 16, and the point F which is the input of the frequency counter 10, so as to measure the frequency of the pulse train which is peculiar to the feedback loop including the driver $5_1$ by the frequency counter 10.

The frequency of the pulse train in this loop then is adjusted by regulating the delay time in the variable delay circuit $6_1$ to be equal to the calibration value already obtained for the first test signal path in the process of adjusting the reference value as described above. Namely, the calibration value has been already recorded based on the previous calibration process and the calibration value is used when it is necessary to calibrate the phase delay time due to the changes in the ambient temperature and the like. The same process will be performed for test signal paths (test channels) including the drivers $5_2$ or $5_3$, if it becomes necessary to calibrate the signal paths with respect to the temperature changes and the like.

In the above explanation, although the frequency of the pulses in the feedback loop is adjusted to be equal to the calibration value, i.e., the difference between the two will be zero, it is also possible to adjust the difference between the frequency in the loop and the calibration value to be a predetermined value. Namely, phase difference data between the calibration value and a feedback loop frequency for a test channel for the test signal $3_1$, for example, is determined. Then for the next test channel for the test signal $3_3$, for example, whose timing is to be adjusted, a phase difference between the calibration value and feedback loop frequency for the channel for the test signal $3_3$ is adjusted to match the phase difference data determined with respect to the test signal $3_1$.

The calibration values used in the above process of calibrating the timing error caused by assigning the different formatter circuits C1–C3 represent the phase delay times of the corresponding test signal paths including the test contactors $2_1$–$2_1$ at the point C and the drivers $5_1$–$5_3$ at the point B. Therefore, the timing calibration with high accuracy is possible since it will not include the timing error based on the difference of signal path extending from the point B which is the output of the drivers 5 to the point D which is the output of the multiplexer 16.

In the above explanation, the frequency counter 10 is used to determine the phase delay time of the feedback loop associated with the test signal path. However, other measuring instruments, such as an oscilloscope, can also be used to determine the reference value or the calibration value both of which represent phase delay times of the selected feedback loops.

As has been described, according to the present invention, the phase delay times in the feedback loops for all of the test signal paths are adjusted to be equal to the reference value. Such feedback loops include the point B having the output of the drivers 5 and the point C having the test contactors 2 corresponding to the test signal paths. Thus, it is possible to minimize the phase delay time differences between the test signal paths to, for example, plus or minus 50 picosecond.

Furthermore, in the present invention, the timing errors caused by changes of circuit structures in the wave-formatters 7 or changes in the environmental conditions such as ambient temperature are effectively compensated based on the calibration value obtained when each of the test signal paths is adjusted to be equal to the reference value. This is because the phase delay time differences between the signal paths extending from the point B which is the output of the drivers 5 to the point D which is the output of the multiplexer 16 through the point D2 are canceled.

I claim:

1. A timing calibration circuit for test signals to be used in a semiconductor test system having a timing generator (8), a plurality of test signal paths each having a wave-formatter (7) for shaping waveforms of a test signal (3) from the timing generator (8), a driver (5) for determining an amplitude of the test signal from the wave-formatter (7) and a test contactor (2) connected to the driver (5) for establishing an electronic connection between a corresponding pin of a semiconductor device (1) to be tested and said semiconductor test system, said timing calibration circuit comprising:

a plurality of variable delay circuits (6) each of which is assigned to one of said test signal paths, each of said variable delay circuits varying a phase delay time for a signal passing therethrough;

a multiplexer (16) for selecting one of said test signal paths for said timing calibration, inputs of said multiplexer being connected to outputs of said drivers;

a first signal path ($12_1$) having a point of connection (G) at one end which is connected to all of said test contactors (2) and another end which is connected to said multiplexer (16);

a means for measuring a phase delay time for signal propagation through a second signal path ($12_2$) connected between said multiplexer (16) and said measuring means when a pulse signal originated by said timing generator for said timing calibration propagates through said second signal path;

said multiplexer (16) selectively forming a first feedback loop and a second feedback loop with respect to each of said test signal paths, said first feedback loop including said driver (5), said test contactor (2) and said first signal path ($12_1$) while said second feedback loop including said driver (5);

said measuring means measuring a phase delay time for said first feedback loop to determine a reference value so that a phase delay time in said first feedback loop for other test signal paths is adjusted by said variable delay circuit to be equal to said reference value, said measuring means measuring a phase delay time for said second feedback loop to determine a calibration value, said calibration value for each of said test signal paths being recorded to be used for later calibration procedures.

2. A timing calibration circuit as defined in claim 1, wherein said second feedback loop is formed by said multiplexer for any one of said test signal paths to be calibrated, said measuring means measures a phase delay time in said second feedback loop so that said phase delay time is adjusted by said variable delay circuit to be equal to said calibration value previously obtained with respect to said test signal path.

3. A timing calibration circuit as defined in claim 2, wherein said phase delay time of said second feedback loop for each of said test signal paths is adjusted by said variable delay circuit to have a fixed phase time difference from said calibration value previously obtained with respect to said test signal path.

4. A timing calibration circuit as defined in claim 1, wherein said measuring means is a frequency counter which determines a phase delay time in said feedback loops based on a frequency of pulse signals in said loops.

5. A timing calibration circuit as defined in claim 1, wherein said measuring means is an oscilloscope which determines a phase delay time in said feedback loops based on waveforms of pulse signals in said loop displayed on said oscilloscope.

6. A timing calibration circuit as defined in claim 1, wherein said reference value is determined by arbitrarily setting said variable delay circuit for one of said test signal paths with respect to said first feedback loop, and phase delay time in said first feedback loop for other test signal paths is adjusted to match with said reference value by adjusting said variable delay circuit.

7. A timing calibration method for test signals to be used in a semiconductor test system having a timing generator (8), a plurality of test signal paths each having a wave-formatter (7) for shaping waveforms of a test signal (3) from the timing generator (8), a driver (5) for determining an amplitude of the test signal from the wave-formatter (7) and a test contactor (2) connected to the driver (5) for establishing an electronic connection between a corresponding pin of a semiconductor device (1) to be tested and said semiconductor test system, said timing calibration method comprising the following steps of:

providing a plurality of variable delay circuits each of which is assigned to one of said test signal paths, each of said variable delay circuits varying a phase delay time for a signal passing therethrough;

selecting one of said test signal paths by a multiplexer, inputs of said multiplexer being connected to outputs of said drivers;

forming a first signal path having a point of connection at one end which is connected to all of said test contactors and another end which is connected to said multiplexer;

measuring a phase delay time for signal propagation through a second signal path connected between said multiplexer and a counter which measures the phase delay time when a pulse signal originated by said timing generator propagates through said second signal path for a timing calibration purpose;

selectively forming a first feedback loop and a second feedback loop with respect to each of said test signal paths, said first feedback loop including said driver, said test contactor and said first signal path while said second feedback loop including said driver;

measuring a phase delay time for said first feedback loop to determine a reference value so that a phase delay time in said first feedback loop for other test signal paths is adjusted by said variable delay circuit to be equal to said reference value; and measuring a phase delay time for said second feedback loop to determine a calibration value, said calibration value for each of said test signal paths being recorded to be used for later calibration procedures.

8. A timing calibration method as defined in claim 7, wherein said method further including the steps of:

forming said second feedback loop for any one of said test signal paths to be calibrated, and measuring a phase delay time in said second feedback loop so that said phase delay time is adjusted by said variable delay circuit to be equal to said calibration value previously obtained with respect to said test signal path.

* * * * *